(12) United States Patent
Ozawa et al.

(10) Patent No.: US 6,305,895 B1
(45) Date of Patent: Oct. 23, 2001

(54) TRANSFER SYSTEM FOR VACUUM PROCESS EQUIPMENT

(75) Inventors: Jun Ozawa; Jun Hirose; Eiji Hirose, all of Yamanashi-Ken; Makoto Ohara, Urayasu, all of (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 09/468,112

(22) Filed: Dec. 21, 1999

(30) Foreign Application Priority Data

Dec. 25, 1998 (JP) .................................................. 10-369139

(51) Int. Cl.$^7$ .................................................. B65G 49/07

(52) U.S. Cl. .................... 414/217; 414/416.03; 414/939; 414/941

(58) Field of Search .................................. 414/217, 939, 414/416.03, 941

(56) References Cited

U.S. PATENT DOCUMENTS

| 4,775,281 | * | 10/1988 | Prentakais | 414/416.03 |
| 5,404,894 | * | 4/1995 | Shiraiwa | 414/217 X |
| 5,658,115 | * | 8/1997 | Yamazaki et al. | 454/225 |

FOREIGN PATENT DOCUMENTS 9-131680    5/1997   (JP) .

\* cited by examiner

*Primary Examiner*—Steven A. Bratlie
(74) *Attorney, Agent, or Firm*—Smith, Gambrell & Russell, LLP (57) ABSTRACT

A transfer system 7 for carrying a wafer W into/out of a process chamber 4 is provided in a box 10 defining a load-lock chamber 3. The box 10 is divided into a first chamber 11 and a second chamber 12. A transfer arm 21 for carrying the wafer W is provided in the first chamber 11. A linearly moving system 14 for linearly moving the transfer arm 21 is provided in the second chamber 12. The internal pressure in the first chamber is set to be higher than the internal pressure in the second chamber.

9 Claims, 10 Drawing Sheets

TRANSFER SYSTEM FOR VACUUM PROCESS EQUIPMENT

BACKGROUND OF THE INVENTION

1. Field of the Invention

The present invention relates generally to a transfer system, which is provided in a vacuum process equipment for an object to be processed, such as a semiconductor wafer or an LCD substrate, for carrying the object into/out of a process chamber.

2. Description of the Related Art

In each of processes for producing semiconductor devices, a transfer system is used for delivering a semiconductor wafer serving as an object to be processed, from a clean room to a process chamber for carrying out a predetermined process, or for delivering a processed semiconductor wafer from the process chamber to the clean room.

As transfer arms serving as transfer systems, there are known a selective compliance assembly robot arm (SCARA) type single pickup, an SCARA type twin pickup, an SCARA dual arm type, a frog leg type and so forth. All of these transfer arms have an articulated structure wherein an arm is pivotably connected. The arm has a swivel mechanism on the proximal end side thereof, and a pick for supporting a semiconductor wafer on the tip side thereof, so as to transfer the wafer by the swiveling motion of the arm and the telescopic motion of a joint portion.

However, the above described transfer systems, such as the SCARA type twin pickup, the SCARA dual arm type and the frog leg type, have a structure complicated by the articulated structure. Therefore, the above described transfer systems have a high rate of occurrence of dust, lack in reliability on transfer and increase costs. In addition, if the transfer system is provided in a load-lock chamber of a semiconductor process equipment, it is required to ensure a space for the swiveling and telescopic motions of the arm, so that the size of the load-lock chamber is increased to cause the increase of the size and costs of the whole system.

SUMMARY OF THE INVENTION

It is therefore an object of the present invention to eliminate the aforementioned problems and to provide a transfer system which can be small and inexpensive by simplifying the structure and operation thereof and which can prevent an object to be processed from being influenced by dust while the object is transferred in a load-lock chamber.

In order to accomplish the aforementioned and other objects, according to one aspect of the present invention, there is provided a transfer system, for use in a vacuum process equipment comprising a process chamber and a load-lock chamber, for carrying an object to be processed, into/out of the process chamber, the transfer system comprising: a first chamber formed in the load-lock chamber; a second chamber formed in the load-lock chamber, the second chamber having an internal pressure which is set to be lower than an internal pressure of the first chamber; linearly moving transfer arm means, provided in the first chamber, for carrying the object to be processed; and a driving part, provided in the second chamber, for linearly moving the transfer arm means with respect to the process chamber.

According to the present invention, the object to be processed can be carried into/out of the process chamber by means of the transfer arm means linearly moved with respect to the process chamber. Therefore, the structure and operation of the transfer system can be simplified to miniaturize the load-lock chamber to reduce the costs of the system. In addition, it is possible to inhibit dust from being produced in the transfer arm portion by using the above described transfer arm, and it is possible to prevent dust from entering the first chamber by setting the internal pressure in the second chamber, in which the driving part is provided, to be lower than the internal pressure in the first chamber, in which the transfer arm is provided. Therefore, the object to be object is not influenced by dust while the object is transferred in the load-lock chamber.

The transfer arm means may have a pair of arm members, each of which has a proximal end portion connected to the driving part, and a distal end portion having a supporting portion for supporting thereon the object to be processed.

Alternatively, the transfer arm means may have a single arm member which has a proximal end portion connected to the driving part, and a distal end portion having a supporting portion for supporting thereon the object to be processed.

The transfer arm means may have a linearly moving arm member connected to the driving part, and a swivel arm member which is pivotably connected to the linearly moving arm member and which has a supporting portion for supporting thereon the object to be processed.

The transfer arm means may comprise upper-stage and lower-stage transfer arms, each of the transfer arms having a pair of arm members, each of the arm members having a proximal end portion connected to the driving part, and a distal end portion having a supporting portion for supporting thereon the object to be processed, and the driving part independently driving each of the transfer arms.

Alternatively, the transfer arm means may comprise upper-stage and lower-stage transfer arms, each of the transfer arms having a single arm member, the arm member having a proximal end portion connected to the driving part, and a distal end portion having a supporting portion for supporting thereon the object to be processed, and the driving part independently driving each of the transfer arms.

The driving part may comprise a motor, a ball screw rotated by the motor, and a nut which is engaged with the ball screw and which linearly moves.

The transfer system may further comprise a buffer mechanism, provided in the load-lock chamber, for receiving the object supported on the transfer arm means.

The transfer system may further comprise a pre-alignment mechanism, provided in the load-lock chamber, for pre-aligning the object supported on the transfer arm means.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings:

FIG. 2a is a horizontal section showing a transfer system in the first preferred embodiment, together with a process chamber;

FIG. 2b is a cross-sectional view of the transfer system of FIG. 2a;

FIG. 2c is a longitudinal section of the transfer system of FIG. 2a;

FIG. 4a is a horizontal section showing the second preferred embodiment of a transfer system according to the present invention, together with a process chamber;

FIG. 4b is a cross-sectional view of the transfer system of FIG. 4a;

FIG. 4c is a longitudinal section of the transfer system of FIG. 4a;

FIG. 6b is a cross-sectional view of the transfer system of FIG. 6a;

FIG. 6c is a longitudinal section of the transfer system of FIG. 6a;

FIG. 7b is a cross-sectional view of the transfer system of FIG. 7a;

FIG. 7c is a longitudinal section of the transfer system of FIG. 7a;

FIG. 8b is a cross-sectional view of the transfer system of FIG. 8a;

FIG. 8c is a longitudinal section of the transfer system of FIG. 8a;

FIG. 9b is a cross-sectional view of the transfer system of FIG. 9a;

FIG. 9c is a longitudinal section of the transfer system of FIG. 9a; and

DESCRIPTION OF THE PREFERRED EMBODIMENTS

Referring now to the accompanying drawings, the first through sixth preferred embodiments of a transfer system for a vacuum process equipment according to the present invention will be described below.

First Preferred Embodiment

Figure 1:
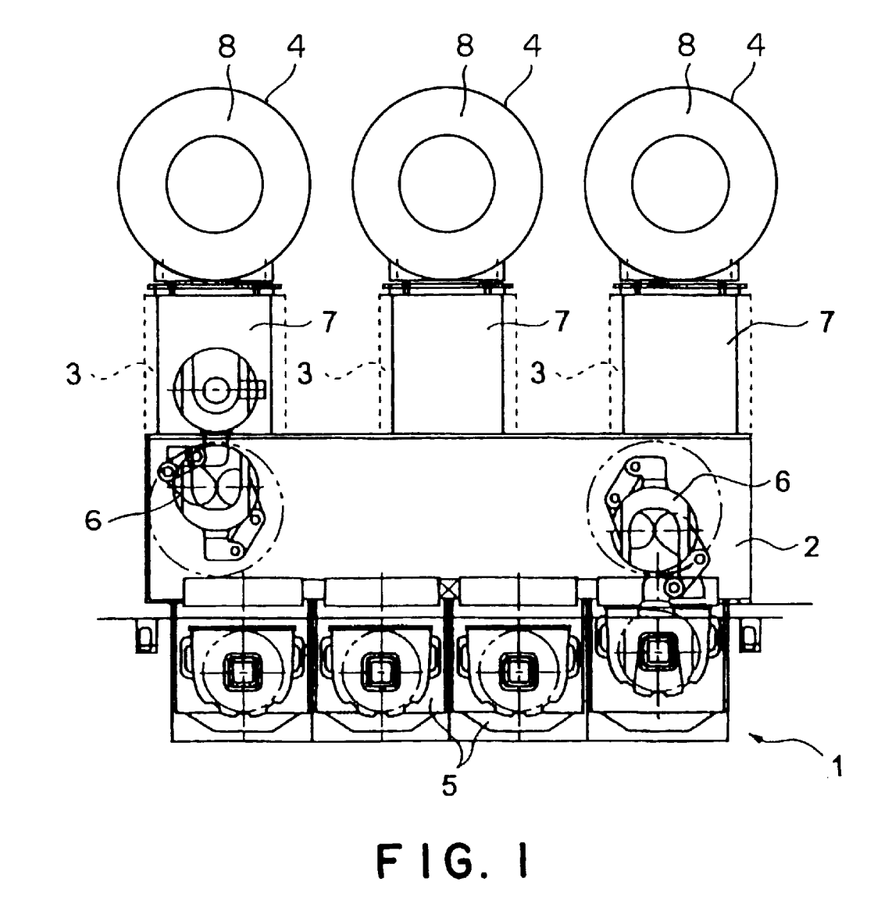
FIG. 1 is a plan view schematically showing the whole vacuum process equipment, to which the first preferred embodiment of a transfer system according to the present invention is applied.
Figures 2A, 2B, 2C:
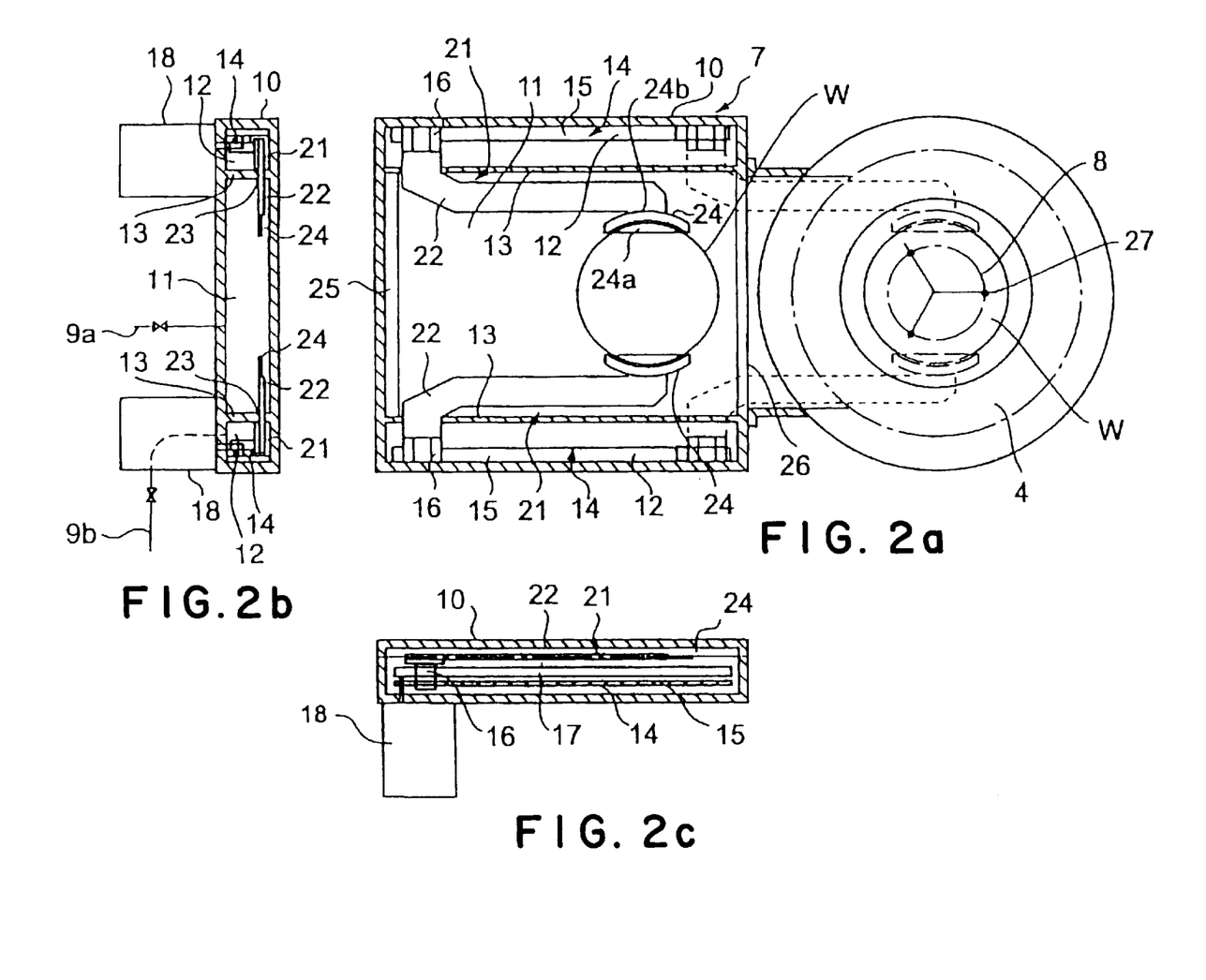
Figure 3:
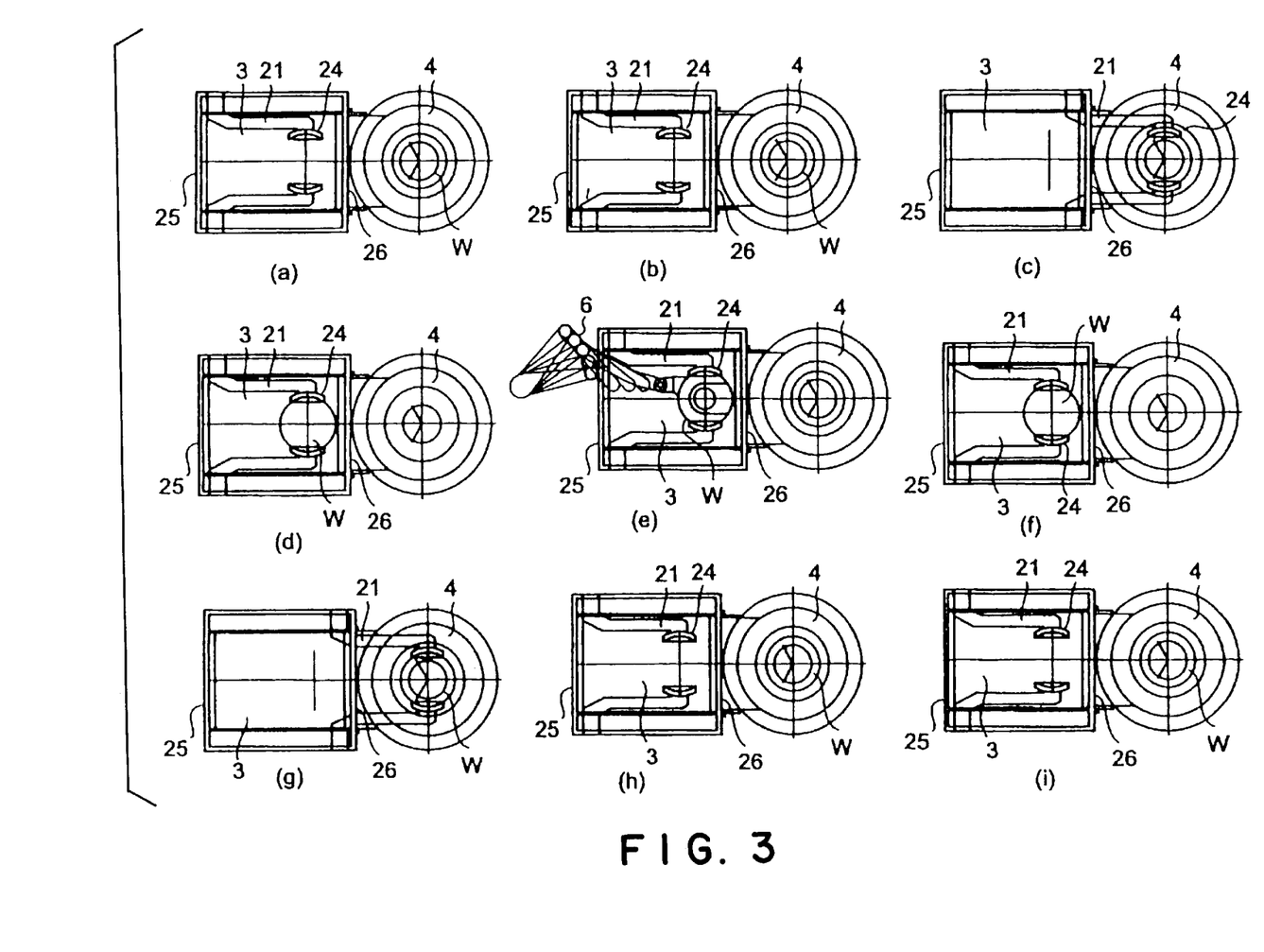
FIG. 3 is a schematic diagram showing the operation of the transfer system in the first preferred embodiment in each of stages.

FIGS. 1 through 3 shows the first preferred embodiment of the present invention. FIG. 1 is a plan view schematically showing a vacuum process equipment for etching a semiconductor wafer serving as an object to be processed. This vacuum process equipment comprises: a housing part 1 for housing semiconductor wafers W (which will be hereinafter simply referred to as "wafers W"); a transfer chamber 2 for carrying the wafers W into/out of the housing part 1; a plurality of load-lock chambers 3 arranged in parallel to the transfer chamber 2; and a plurality of process chambers 4, each of which is connected directly to a corresponding one of the load-lock chambers 3.

In the housing part 1, a plurality of wafer cassettes 5 for supporting tens of wafers W at regular intervals are arranged in parallel. The transfer chamber 2 is provided with a an SCARA dual arm type transfer arm mechanism 6, which is movable in longitudinal directions of the transfer chamber 2, for carrying the wafers W into/out of the wafer cassettes 5. Moreover, each of the load-lock chambers 3 is provided with a transfer system 7 which will be described later, and each of the process chambers 4 is provided with an etching process mechanism 8.

This vacuum process equipment is designed to introduce a single wafer W from the wafer cassette 5 into the load-lock chamber 3 by means of the transfer arm mechanism 6. Then, after the wafer W carried into the load-lock chamber 3 is received by the transfer system 7 to be aligned, the wafer W is carried into the process chamber 4. The wafer W etched by the etching process mechanism 8 in the process chamber 4 is discharged to the load-lock chamber 3 by the transfer system 7. In addition, the transfer system 7 is designed to deliver the processed wafer W to the transfer arm mechanism 6, and the transfer arm mechanism 6 is designed to return the processed wafer W to the wafer cassette 5.

Referring to FIGS. 2a through 2c, the transfer system 7 will be described below. In the drawing, reference number 10 denotes a rectangular parallelepipedic closed box defining the load-lock chamber 3. In the central portion of the box 10, a wide first chamber 11 is provided. On both sides of the first chamber 11, narrow second chambers 12 are provided. The first chamber 11 is separated from each of the second chambers 12 by a corresponding one of partition walls 13.

In order to control the pressures in the first chamber 11 and second chamber 12 between atmospheric pressure and vacuum pressure, the box 10 is provided with a supply pipe 9a for supplying $N_2$ gas and a vacuum suction pipe 9b for evacuating the box 10. In this preferred embodiment, the supply pipe 9a is connected to the first chamber 11, and the vacuum suction pipe 9b is connected to each of the second chambers 12, so that a gas flow is formed from the first chamber 11 to the second chambers 12.

Each of the pair of second chambers 12 arranged symmetrically about the first chamber 11 is provided with a linearly moving system 14 serving as a driving part. The linearly moving system 14 comprises a ball screw 15, a nut 16 engaged with the ball screw 15, and a linear guide 17. To the bottom of the box 10, a reciprocally rotatable motor 18 is fixed so as to face a corresponding one of linearly moving systems 14. The rotation of the motor 18 is transmitted to the ball screw 15 by means of a reduction gear (not shown).

The nut 16 engaged with each of the pair of ball screws 15 is guided by the linear guide 17, so that the reciprocal rotation of the ball screw 15 is converted into linear reciprocating motion. A linearly moving transfer arm 21 is fixed to the nut 16.

The transfer arm 21 comprises a pair of L-shaped bent arm members 22. The proximal end portion of each of the arm members 22 is fixed to the nut 16. The bent portion of each of the arm members 22 passes through a slit 23 formed in a corresponding one of the partition walls 13, to project into the first chamber 11. Each of the arm members 22 extending from the bent portion to distal end portion thereof extends along the corresponding one of the partition walls 13 toward the process chamber 4. The distal end portion of each of the arm members 22 is provided with a supporting portion 24 for supporting thereon the wafer W. Furthermore, the slit 23 is preferably sealed with a labyrinth seal.

The supporting portion 24 has a pivotably supporting portion 24a for pivotably supporting a part of the outer periphery of the wafer W so as to support the wafer W in a horizontal state. The pivotably supporting portion 24a is provided with an arcuate protruding wall 24b extending along the curvature of the wafer W.

The box 10 of the transfer system 7 is an atmosphere-side gate valve 25 on the side of the transfer chamber 2 (FIG. 1) (on the left side in FIG. 2a). The pressure in the first chamber 11 is set to be higher than the pressure in the second chamber 12 by the supply (the formation of the gas flow) of $N_2$ gas from the supply pipe 9a. Thus, even if dust is produced in the second chamber 12 equipped with the linearly moving system 14, the dust is prevented from entering the first chamber 11 from the slit 23.

Moreover, a process-chamber-side gate valve 26 is provided between the box 10 and the process chamber 4. By this gate valve 26, the degree of vacuum in the process chamber 4 is held during an etching process. The etching process mechanism 8 of the process chamber 4 is provided with a plurality of lifter pins 27 for supporting and vertically moving the wafer W. These lifter pins 27 are designed to deliver the wafer W to the supporting portion 24 of the arm member 22.

Referring to FIG. 3, the operation of the first preferred embodiment of the present invention in each of stages (a) through (i) will be described below.

FIG. 3(a) shows a stage in which the wafer W is being etched in the process chamber 4. In this case, the process-chamber-side gate valve 26 is closed, and the transfer arm 21 is positioned at a retracted position in the load-lock chamber 3 (the first chamber 11: the same thereafter).

In the stage of FIG. 3(b), the etching process of the wafer W is completed, and the wafer W is moved upwards by the lifter pins 27. Simultaneously, the process-chamber-side gate valve 26 is open.

FIG. 3(c) shows a stage in which the processed wafer W is carried out of the process chamber 4. In this case, in FIGS. 2a through 2c, the motor 18 first positively rotates, so that the ball screw 15 rotates. By the rotation of the ball screw 15, the nut 16 moves forward toward the process chamber 4 while being guided by the linear guide 17, and the transfer arm 21 moves forward. Then, when the supporting portion 24 of the transfer arm 21 projects into the process chamber 4 to be positioned below the wafer W, the lifter pins 27 move downwards, and the wafer W is mounted on the supporting portion 24.

FIG. 3(d) shows a stage in which the processed wafer W is carried out of the process chamber 4 to the load-lock chamber 3. In this case, in FIGS. 2a through 2c, the motor 18 reversely moves, so that the ball screw 15 rotates. By the rotation of the ball screw 15, the nut 16 moves rearward while being guided by the linear guide 17, and the transfer arm 21 is retracted. Then, when the wafer W supported on the supporting portion 24 of the transfer arm 21 is transferred into the load-lock chamber 3, the process-chamber-side gate valve 26 is closed. Then, when $N_2$ gas is supplied into the load-lock chamber 3 so that the pressure in the load-lock chamber 3 is atmospheric pressure, the atmosphere-side gate valve 25 is open.

FIG. 3(e) shows a stage in which the processed wafer W is carried out of the load-lock chamber 3. In this case, the arms of the transfer arm mechanism 6 provided in the transfer chamber 2 shown in FIG. 1 extend to project into the load-lock chamber 3, and hold the processed wafer W supported on the supporting portion 24 of the transfer arm 21, to discharge the processed wafer W into a predetermined one of the cassettes 5 to house the processed wafer W therein. Moreover, the transfer arm mechanism 6 takes an unprocessed wafer W out of a predetermined one of the cassettes 5 to mount the unprocessed wafer W on the supporting portion 24 of the standby transfer arm 21.

FIG. 3(f) shows a stage in which the atmosphere-side gate valve 25 is closed to evacuate the load-lock chamber 3, and the process-chamber-side gate valve 26 is open.

FIG. 3(g) shows a stage in which the unprocessed wafer W is carried into the process chamber 4. In this case, in FIGS. 2a through 2c, the motor 18 positively moves, so that the ball screw 15 rotates. By the rotation of the ball screw 15, the nut 16 moves forward toward the process chamber 4 while being guided by the linear guide 17, and the transfer arm 21 moves forward. Then, the supporting portion 24 of the transfer arm 21, on which the wafer W is supported, projects into the process chamber 4 to be positioned above the bottom electrode of the etching process mechanism 8 shown in FIG. 2a. Then, the lifter pins 27 move upwards to receive the wafer W from the supporting portion 24.

FIG. 3(h) shows a stage in which the transfer arm 21 is retracted, the lifter pins 27 move downwards, the wafer W is mounted on the bottom electrode of the etching process mechanism 8 in the process chamber 4, and the process-chamber-side gate valve 26 is closed. In this case, in FIGS. 2a through 2c, the motor 18 reversely rotates, so that the ball screw 15 rotates. By the rotation of the ball screw 15, the nut 16 moves rearward while being guided by the linear guide 17, and the transfer arm 21 is retracted. Then, the supporting portion 24 of the transfer arm 21 is transferred into the load-lock chamber 3.

FIG. 3(i) shows a stage in which the etching process of the wafer W in the process chamber 4 is started. In this case, the transfer arm 21 is waiting in the load-lock chamber 3 until the etching process is completed.

By repeating the above described operation in the stages of FIGS. 3(a) through 3(i), the wafer w can be carried into/out of the process chamber 4 by the linear reciprocating motion of the transfer arm 21. Thus, by providing the transfer arm 21 in the load-lock chamber 3, it is possible to miniaturize the load-lock chamber 3.

In addition, a buffer mechanism may be provided in the load-lock chamber 3 on the side of the process chamber 4 to facilitate the delivery of the wafer W to the transfer arm mechanism 6. Moreover, a pre-alignment mechanism may be provided in the load-lock chamber 3 on the side of the process chamber 4 to pre-align the wafer W before being carried into the process chamber 4.

Second Preferred Embodiment

FIGS. 4a through 4c and 5 show the second preferred embodiment of the present invention. In these figures, the same reference numbers are applied to the same constructions as those in the first preferred embodiment, and the descriptions thereof will be omitted. In this preferred embodiment, a pair of upper-stage and lower-stage linearly moving systems 14 and a pair of upper-stage and lower-stage linearly moving transfer arms 21, which have substantially the same structure as those in the first preferred embodiment, are provided in the load-lock chamber 3.

The upper-stage and lower-stage linearly moving systems 14 have basically the same structure, and the upper-stage and lower-stage transfer arms 21 have basically the same structure. Therefore, in FIGS. 4a through 4c, a is added after each of the reference numbers of the upper-stage first linearly moving system 14 and the upper-stage first transfer arm 21, and b is added after each of the reference numbers of the lower-stage second linearly moving system 14 and the lower-stage second transfer arm 21.

Figure 5:
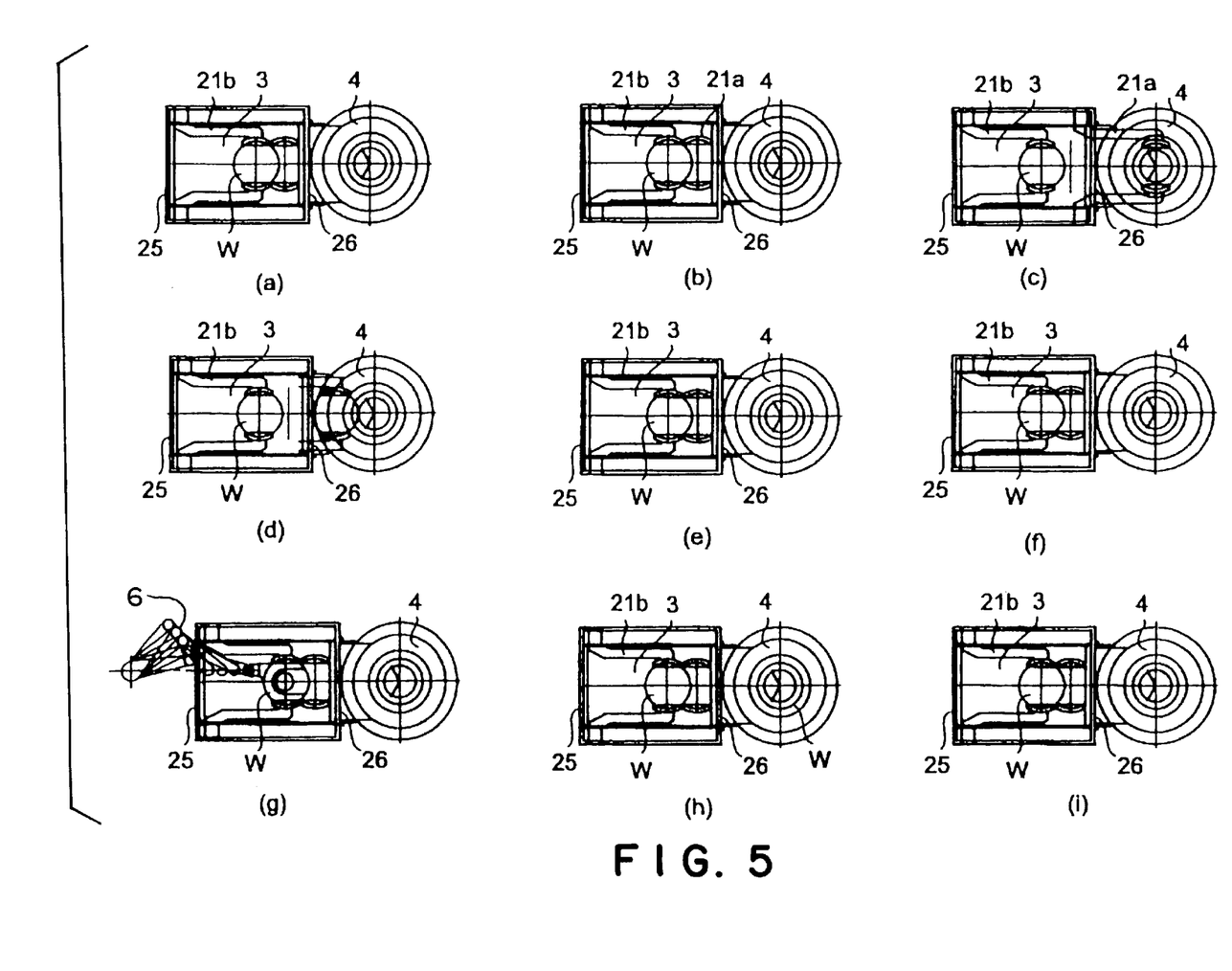
FIG. 5 is a schematic diagram showing the operation of the transfer system in the second preferred embodiment in each of stages.

Referring to FIG. 5, the operation of the second preferred embodiment of the present invention in each of stages (a) through (i) will be described below.

FIG. 5(a) shows a stage in which the wafer W is being etched in the process chamber 4. In this case, the process-chamber-side gate valve 26 is closed, and the first and second transfer arms 21a and 21b are in stand-by states in the load-lock chamber 3. That is, the first transfer arm 21a is waiting to discharge a processed wafer W, and the supporting portion 24a thereof is empty. On the other hand, an unprocessed wafer W is mounted on the supporting portion 24b of the second transfer arm 21b.

In the stage of FIG. 5(b), the etching process of the wafer W is completed, and the wafer W is moved upwards by the lifter pins 27. Simultaneously, the process-chamber-side gate valve 26 is open.

FIG. 5(c) shows a stage in which the processed wafer W is carried out of the process chamber 4. In this case, in FIGS. 4a through 4c, the motor 18a of the first linearly moving system 14a first positively rotates, so that the ball screw 15a rotates. By the rotation of the ball screw 15a, the nut 16a moves forward toward the process chamber 4 while being guided by the linear guide 17a, and the first transfer arm 21a moves forward. Then, when the supporting portion 24a of the first transfer arm 21a projects into the process chamber 4 to be positioned below the wafer W, the lifter pins 27 move downwards, and the wafer W is mounted on the supporting portion 24a.

FIG. 5(d) shows a stage in which the processed wafer W is carried out of the process chamber 4 to the load-lock chamber 3. In this case, in FIGS. 4a through 4c, the motor 18a reversely moves, so that the ball screw 15a rotates. By the rotation of the ball screw 15a, the nut 16a moves rearward while being guided by the linear guide 17a, and the first transfer arm 21a is retracted. Then, the wafer W supported on the supporting portion 24a of the first transfer arm 21a is transferred into the load-lock chamber 3.

Figures 4A, 4B:
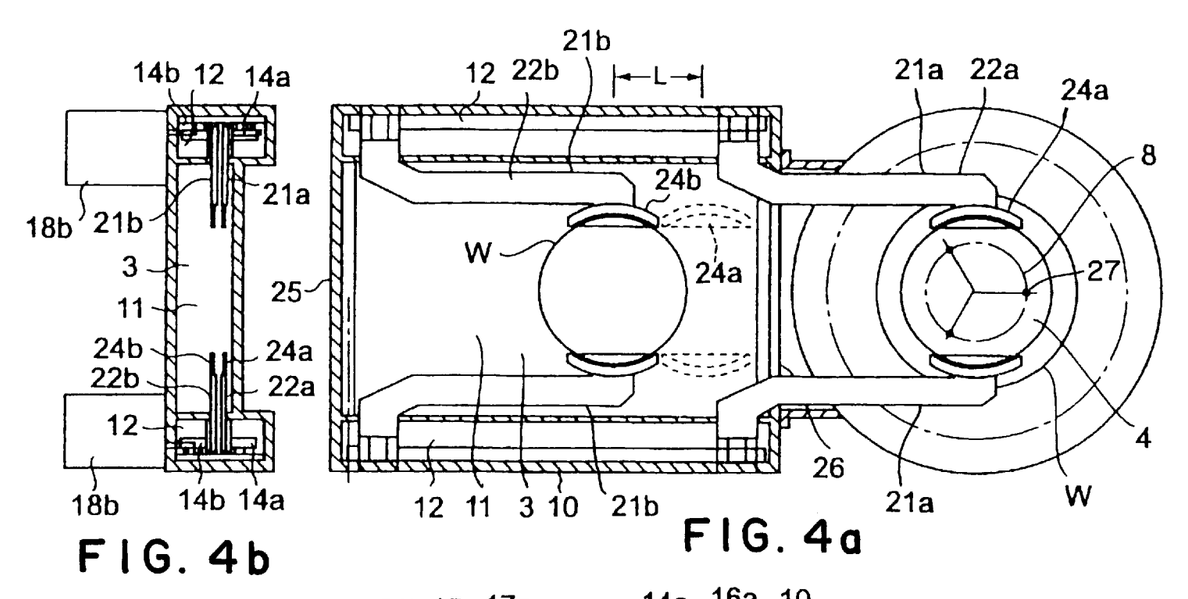
Figure 4C:
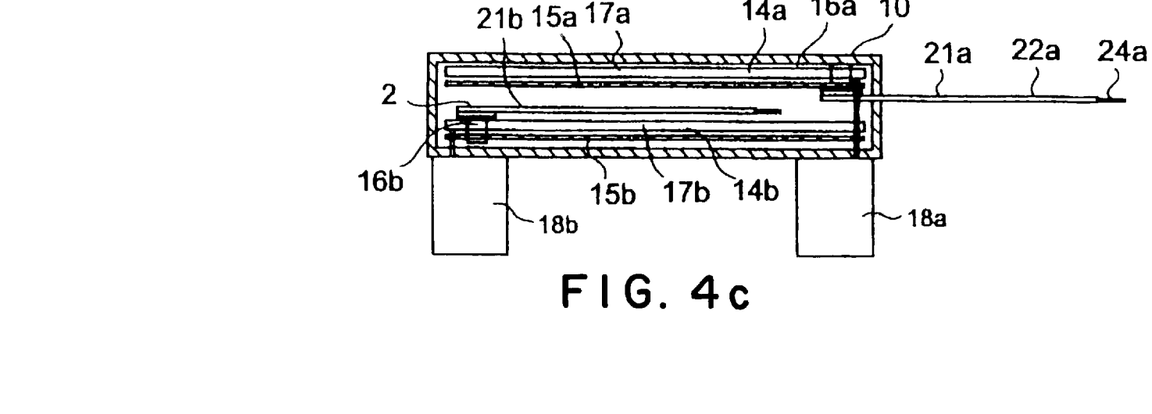

Then, in FIGS. 4a through 4c, the motor 18b of the second linearly moving system 14b positively rotates, so that the ball screw 15b rotates. By the rotation of the ball screw 15b, the nut 16b moves forward toward the process chamber 4 while being guided by the linear guide 17b, and the second transfer arm 21b moves forward. Then, the unprocessed wafer W mounted on the supporting portion 24b of the second transfer arm 21b is positioned in the process chamber 4. Then, when the lifter pins 27 move upwards to receive the unprocessed wafer W from the supporting portion 24b, the second transfer arm 21b is retracted.

FIG. 5(e) shows a stage in which the lifter pins 27 move downwards, and the wafer W is mounted on the bottom electrode of the etching process mechanism 8 (FIG. 1). In this case, the process-chamber-side gate valve 26 is closed, and an etching process is carried out in the process chamber 4.

FIG. 5(f) shows a stage in which the load-lock chamber 3 is open to atmosphere by opening the atmosphere-side gate valve 25 after supplying N₂ gas to the load-lock chamber 3.

FIG. 5(g) shows a stage in which the processed wafer W is carried out of the load-lock chamber 3. In this case, after the arms of the transfer arm mechanism 6 provided in the transfer chamber 2 shown in FIG. 1 extend to project into the load-lock chamber 3, Z-axis is raised, and the processed wafer W supported on the supporting portion 24a of the first transfer arm 21a is held to be discharged to be housed in a predetermined one of the cassettes 5. Moreover, the transfer arm mechanism 6 takes an unprocessed wafer W out of a predetermined one of the cassettes 5 to mount the unprocessed wafer W on the supporting portion 24b of the standby second transfer arm 21b.

At this time, in order to prevent the transfer arm mechanism 6, the first and second transfer arms 21a and 21b in the load-lock chamber 3, and the wafer W transferred by the transfer arm mechanism 6 from interfering with each other, a shifted distance L is provided between the supporting portion 24a of the first transfer arm 21a and the supporting portion 24b of the second transfer arm 21b, if necessary, as shown in FIG. 4a.

Then, the atmosphere-side gate valve 25 is closed to evacuate the load-lock chamber 3, and the process-chamber-side gate valve 26 is open. Then, in FIGS. 4a through 4c, the motor 18a positively moves, so that the ball screw 15a rotates. By the rotation of the ball screw 15a, the nut 16a moves forward toward the process chamber 4 while being guided by the linear guide 17a, and the first transfer arm 21a moves forward. Then, the supporting portion 24a of the first transfer arm 21a projects into the process chamber 4, and the lifter pins 27 move downwards, so that the wafer W is mounted on the supporting portion 24a.

In the stage of FIG. 5(h), in FIGS. 4a through 4c, the motor 18a first reversely rotates, so that the ball screw 15a rotates. By the rotation of the ball screw 15a, the nut 16a moves rearward while being guided by the linear guide 17a, and the first transfer arm 21a is retracted. Then, the supporting portion 24a of the first transfer arm 21a is transferred into the load-lock chamber 3.

Then, the motor 18b of the second linearly moving system 14b is positively rotated to introduce the unprocessed wafer W, which is mounted on the supporting portion 24b of the second transfer arm 21b, into the process chamber 4. Then, when the lifter pins 27 move upwards to receive the wafer W from the supporting portion 24b, the second transfer arm 21b is retracted. Then, when the lifter pins 27 move downwards to mount the wafer W on the bottom electrode, the process-chamber-side gate valve 26 is closed.

FIG. 5(i) shows a stage in which the etching process of the wafer W in the process chamber 4 is started. In this case, the first and second transfer arms 21a and 21b are waiting in the load-lock chamber 3 until the etching process is completed.

By repeating the above described operation in the stages of FIGS. 5(a) through 5(i), while the etching process of the wafer W is carried out, the first and second transfer arms 21a and 21b causes the next wafer W to stand by in the load-lock chamber 3, so that the wafer W can be carried into/out of the process chamber 4 without taking a stand-by time.

As described above, in this preferred embodiment, the procesesed wafer W is transferred by the upper-stage first transfer arm 21a, and the unprocessed wafer W is transferred by the lower-stage second transfer arm 21b. On the other hand, the unprocessed wafer w may be transferred by the upper-stage first transfer arm 21a, and the processed wafer W may be transferred by the lower-stage second transfer arm 21b. In the latter, dust or the like adhering to the processed wafer W drops during transfer, so that it is possible to prevent dust or the like from adhering to the unprocessed wafer W.

Third Preferred Embodiment

Figure 6A:
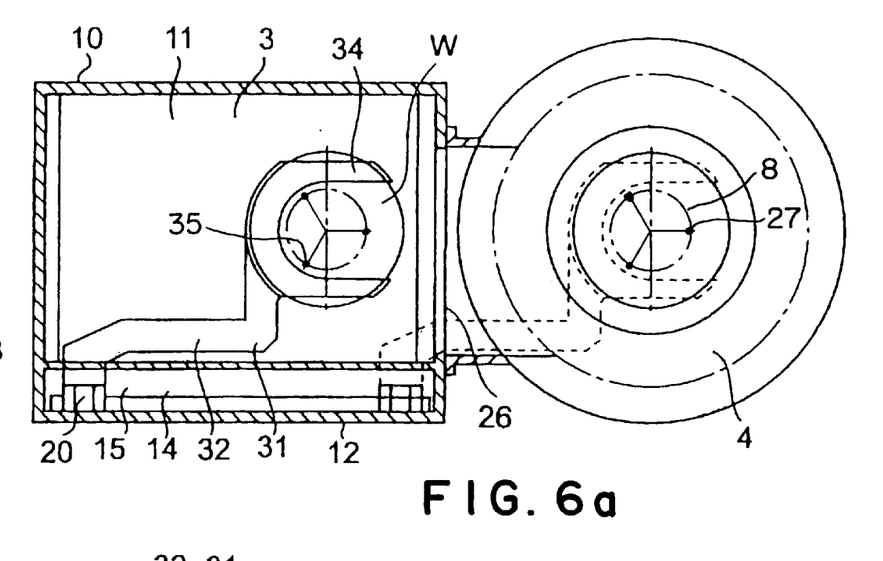
FIG. 6a is a horizontal section showing the third preferred embodiment of a transfer system according to the present invention, together with a process chamber.
Figure 6B:
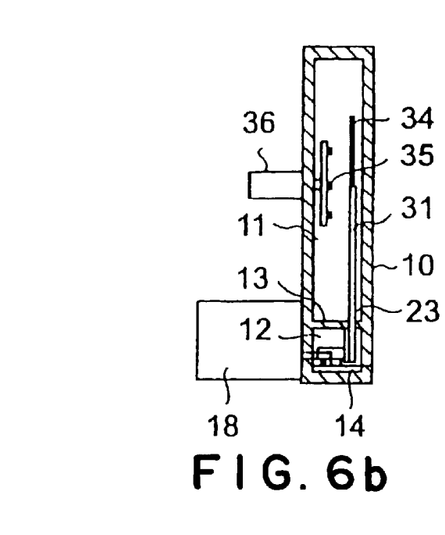
Figure 6C:
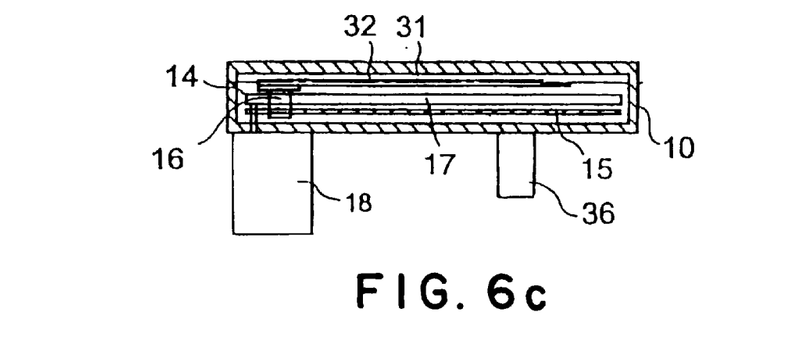

FIGS. 6a through 6c show the third preferred embodiment of the present invention. In these figures, the same reference numbers are applied to the same constructions as those in the first preferred embodiment, and the descriptions thereof will be omitted. In this preferred embodiment, a linearly moving transfer arm 31 comprising a single arm member 32 is substituted for the linearly moving transfer arm 21 comprising the pair of arm members 22 in the first preferred embodiment.

As shown in FIGS. 6a through 6c, in this preferred embodiment, a second chamber 12 separated from a first chamber 11 by a partition wall 13 is provided on one side of a box 10 of a transfer system 7. In the second chamber 12, a linearly moving system 14 is provided.

Similar to the first preferred embodiment, the linearly moving system 14 comprises a ball screw 15, a nut 16 engaged with the ball screw 15, and a linear guide 17. To the bottom of the box 10, a motor 18 is fixed so as to face the linearly moving systems 14. The rotation of the motor 18 is transmitted to the ball screw 15 by means of a reduction gear (not shown).

The nut 16 engaged with the ball screws 15 is guided by the linear guide 17, so that the reciprocal rotation of the ball screw 15 is converted into linear reciprocating motion. A transfer arm 31 is fixed to the nut 16.

The transfer arm 31 comprises a single L-shaped bent arm member 32. The proximal end portion of the arm member 32 is fixed to a nut 20. The bent portion of the arm member 32 passes through a slit 23 formed in the partition wall 13, to project into the first chamber 11. The arm member 32 extending from the bent portion to distal end portion thereof extends along the partition wall 13 toward the process chamber 4. The distal end portion of the arm member 32 is provided with a forked supporting portion 34 for supporting thereon the wafer W.

A lifter pin 35 is provided on the bottom of the load-lock chamber 3 at a position at which the transfer arm 31 faces the supporting portion 34 when it is extremely retracted in the load-lock chamber 3 (FIGS. 6a and 6b). The lifter pin 35 is designed to move vertically by means of an air cylinder 36 (FIGS. 6b and 6c). The lifter pin 35 serves as a buffer mechanism for vertically moving the wafer W, and a pre-alignment mechanism for pre-aligning the wafer W.

The operation of the third preferred embodiment of the present invention will be abridged to be briefly described below.

First, the transfer arm 31 is positioned at a retracted position, and the lifter pin 35 is positioned at a raised position by the air position 36. At this time, an unprocessed wafer W carried by the transfer arm mechanism 6 (FIG. 1) is held in a horizontal state by the lifter pin 35. Then, when the lifter pin 35 moves downwards, the wafer W is mounted on the supporting portion 34 of the transfer arm 31.

Then, when a process-chamber-side gate valve 26 is open and when the motor 18 positively rotates and the ball screw 15 rotates, the rotation of the ball screw 15, the nut 16 moves forward toward the process chamber 4 while being guided by the linear guide 17, and the transfer arm 31 moves forward. Then, when the supporting portion 34 of the transfer arm 31, on which the wafer W is supported, projects into the process chamber 4 to be positioned above the bottom electrode of the etching process mechanism 8, the lifter pin 27 moves upwards to receive the wafer W from the supporting portion 34.

When the introduction of the wafer W is completed, the transfer arm 31 is retracted to return to the original position in the load-lock chamber 3. When the etching process is completed, the transfer arm 31 moves forward again to discharge the wafer W in the process chamber 4.

According to this preferred embodiment, since the wafer W can be carried and discharged by the transfer arm 31 comprising the single arm member 32, the structure can be more simple than that in the first preferred embodiment, so that it is possible to reduce costs.

Fourth Preferred Embodiment

Figure 7A:
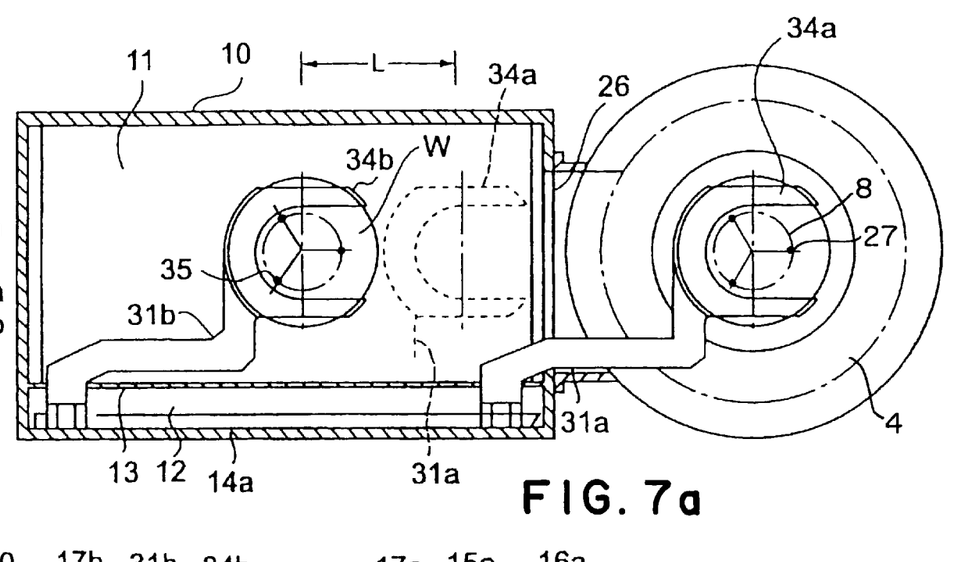
FIG. 7a is a horizontal section showing the fourth preferred embodiment of a transfer system according to the present invention, together with a process chamber.
Figure 7B:
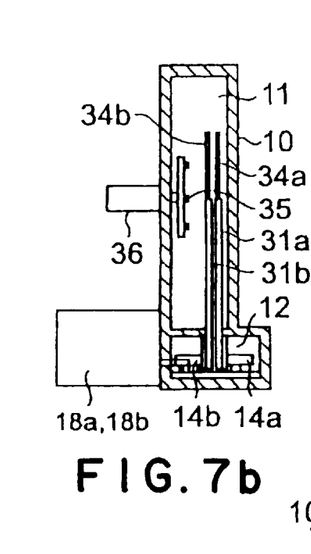
Figure 7C:
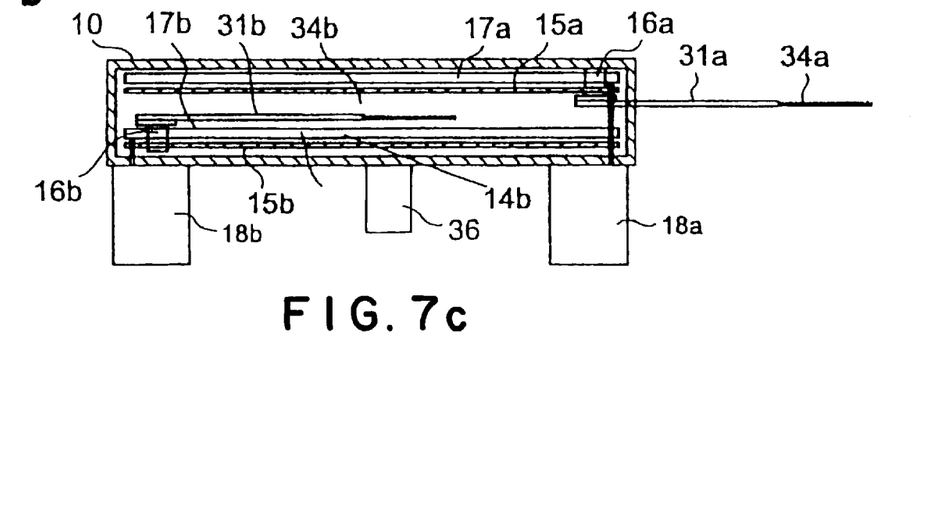

FIGS. 7a through 7c show the fourth preferred embodiment of the present invention. In these figures, the same reference numbers are applied to the same constructions as those in the first and third preferred embodiments, and the descriptions thereof will be omitted. In this preferred embodiment, a pair of upper-stage and lower-stage linearly moving systems 14 and a pair of upper-stage and lower-stage linearly moving transfer arms 31, which have substantially the same structure as those in the third preferred embodiment respectively, are provided in the load-lock chamber 3.

The upper-stage and lower-stage linearly moving systems 14 have basically the same structure, and the upper-stage and lower-stage transfer arms 31 have basically the same structure. Therefore, in FIGS. 7a through 7c, a is added after each of the reference numbers of the upper-stage first linearly moving system 14 and the upper-stage first transfer arm 31, and b is added after each of the reference numbers of the lower-stage second linearly moving system 14 and the lower-stage second transfer arm 31.

The operation of the fourth preferred embodiment of the present invention will be abridged to be briefly described below.

First, while the wafer W is being etched in the process chamber 4, the process-chamber-side gate valve 26 is closed, and the first and second transfer arms 31a and 31b are in stand-by states in the first chamber 11 of the load-lock chamber 3. That is, the first transfer arm 31a is waiting to discharge a processed wafer W, and the supporting portion 34a thereof is empty. On the other hand, an unprocessed wafer W is mounted on the supporting portion 34b of the second transfer arm 31b.

When the etching process of the wafer W is completed, the wafer W is moved upwards by the lifter pins 27. Simultaneously, the process-chamber-side gate valve 26 is open. Then, the motor 18a of the first linearly moving system 14a first positively rotates, so that the ball screw 15a rotates. By the rotation of the ball screw 15a, the nut 16a moves forward toward the process chamber 4 while being guided by the linear guide 17a, and the first transfer arm 31a moves forward. Then, when the supporting portion 34a of the first transfer arm 31a projects into the process chamber 4 to be positioned below the wafer W, the lifter pins 27 move downwards, and the wafer W is mounted on the supporting portion 34a.

Then, the motor 18a reversely moves, so that the ball screw 15a rotates. By the rotation of the ball screw 15a, the nut 16a moves rearward while being guided by the linear guide 17a, and the first transfer arm 31a is retracted. Then, the wafer W supported on the supporting portion 34a of the first transfer arm 31a is transferred into the load-lock chamber 3.

Then, the motor 18b of the second linearly moving system 14b positively rotates, so that the ball screw 15b rotates. By the rotation of the ball screw 15b, the nut 16b moves forward toward the process chamber 4 while being guided by the linear guide 17b, and the second transfer arm 31b moves forward. Then, when the unprocessed wafer W mounted on the supporting portion 34b of the second transfer arm 31b is positioned in the process chamber 4, the lifter pins 27 move upwards to receive the unprocessed wafer W from the supporting portion 34b.

Thereafter, the second transfer arm 31b is retracted to return to the original position in the load-lock chamber 3. When the etching process is completed, the first transfer arm 31a moves forward again to discharge the wafer W in the process chamber 4.

According to this preferred embodiment, the first and second transfer arms 31a and 31b causes the next wafer W to stand by in the load-lock chamber 3 during etching, so that the wafer W can be carried into/out of the process chamber 4 without taking a stand-by time. In addition, since the wafer W can be carried and discharged by the transfer arms 31a and 31b, which comprise the single arm members 32a and 32b, respectively, the structure can be more simple than that in the second preferred embodiment, so that it is possible to reduce costs.

Furthermore, similar to the second preferred embodiment, if the unprocessed wafer W is transferred by the upper-stage first transfer arm 31a, and if the processed wafer W may be transferred by the lower-stage second transfer arm 31b, dust or the like adhering to the processed wafer W drops during transfer, so that it is possible to prevent dust or the like from adhering to the unprocessed wafer W.

Fifth Preferred Embodiment

Figure 8A:
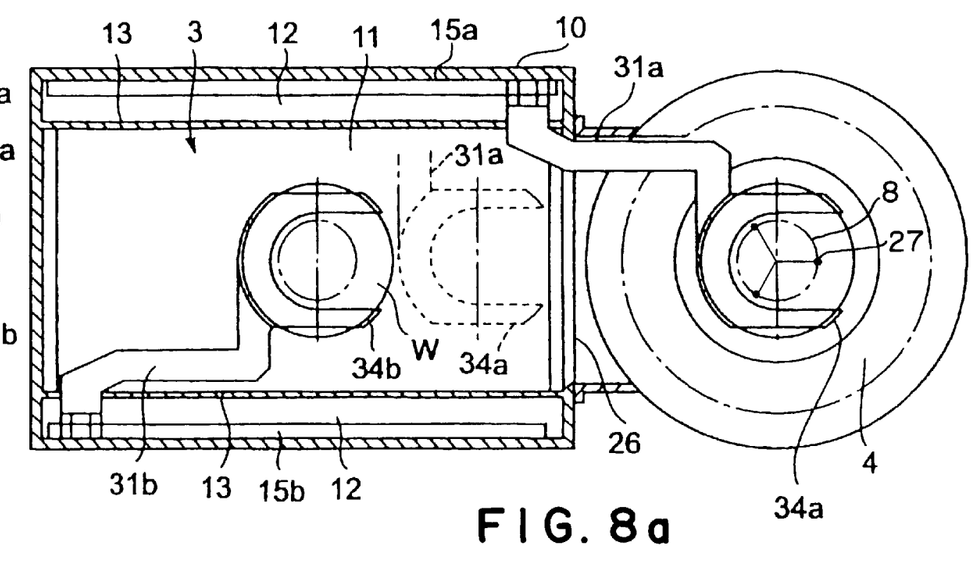
FIG. 8a is a horizontal section showing the fifth preferred embodiment of a transfer system according to the present invention, together with a process chamber.
Figure 8B:
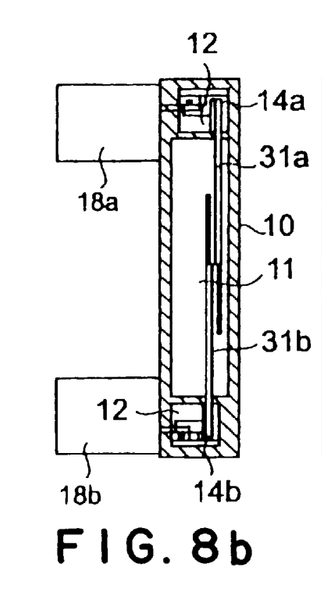
Figure 8C:
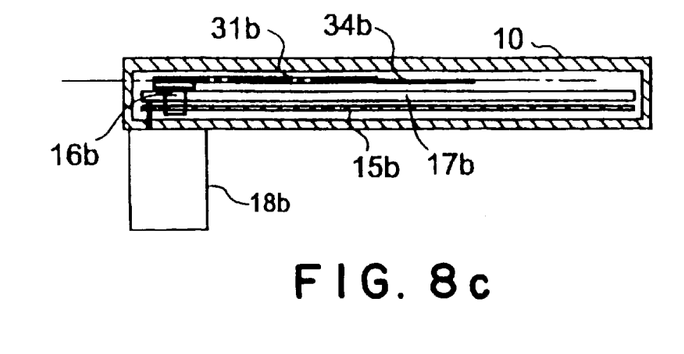

FIGS. 8a through 8c shows the fifth preferred embodiment of the present invention. In this preferred embodiment, second chambers 12, each of which is substantially the same as the second chamber 12 provided on one side of the box 10 in the fourth preferred embodiment, are provided on both sides of the box 10, and first and second linearly moving systems 14a, 14b and first and second linearly moving transfer arms 31a, 31b are provided so as to correspond to the second chambers 12 on both sides, respectively. Other constructions and operation are substantially the same as those in the fourth preferred embodiment, so that the descriptions thereof are omitted.

Sixth Preferred Embodiment

FIGS. 9a through 9c and 10 show the sixth preferred embodiment of the present invention. In these figures, the same reference numbers are applied to the same constructions as those in the first and third preferred embodiments, and the descriptions thereof will be omitted. In this preferred embodiment, a linearly moving transfer arm 41 comprising a linearly moving arm member 42 and a swivel arm member 44 is substituted for the linearly moving transfer arm 31 comprising the single arm member 32 in the third preferred embodiment.

Figure 9A:
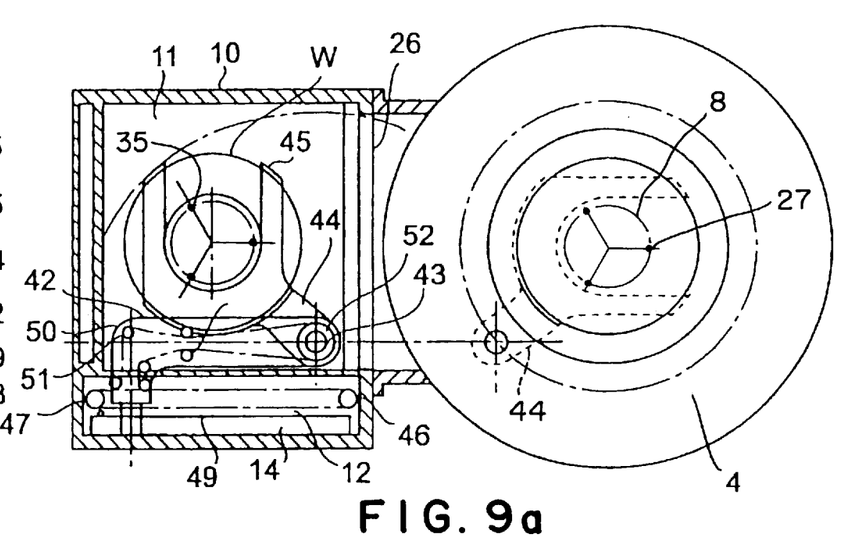
FIG. 9a is a horizontal section showing the sixth preferred embodiment of a transfer system according to the present invention, together with a process chamber.
Figure 9B:
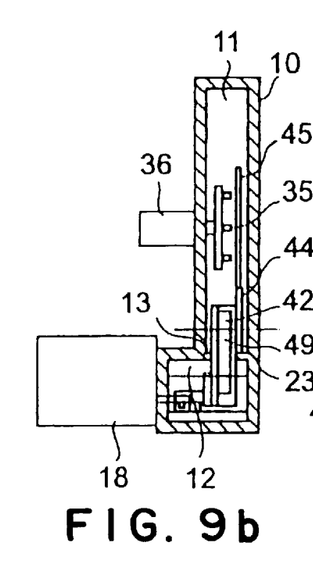
Figure 9C:
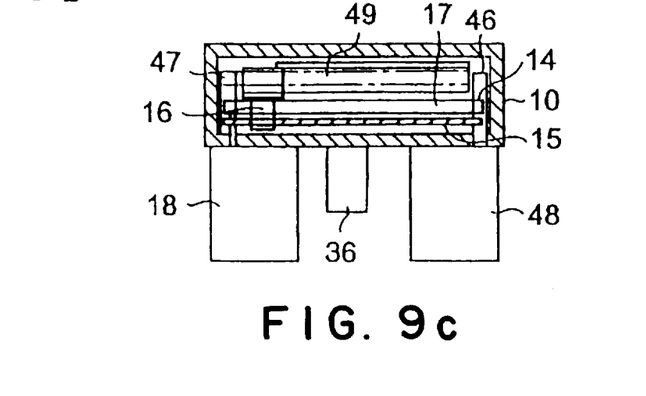

As shown in FIGS. 9a through 9c, in this preferred embodiment, a second chamber 12 separated from a first chamber 11 by a partition wall 13 is provided on one side of a box 10 of a transfer system 7. In the second chamber 12, a linearly moving system 14 is provided. In the linearly moving system 14, a nut 16 engaged with a ball screw 15 is guided by a linear guide 17, so that the reciprocal rotation of the ball screw 15 is converted into linear reciprocating motion.

In addition, the transfer arm 41 is fixed to the nut 16. Specifically, the proximal end portion of a substantially L-shaped linearly moving arm member 42 of the transfer arm 41 is fixed to the nut 16. The swivel arm member 44 is pivotably connected to the distal end portion of the linearly moving arm member 42 via a pivotal shaft 43. The distal end portion of the swivel arm member 44 is provided with a forked supporting portion 45 for supporting thereon the wafer W.

The bent portion of the linearly moving arm member 42 passes through a slit 23 formed in the partition wall 13, to project into the first chamber 11. The linearly moving arm member 42 extending from the bent portion to the distal end portion thereof extends along the partition wall 13 toward the process chamber 4. The swivel arm member 44 is designed to reciprocate along a predetermined path between the load-lock chamber 3 and the process chamber 4, by the linear reciprocating motion of the linearly moving arm member 42 and the swiveling motion of the swivel arm member 44.

In addition, a driving pulley 46 and a driven pulley 47 are provided on both sides of the second chamber 12 in longitudinal directions. The driving pulley 46 is mounted on the rotating shaft of a belt driving motor 48 provided on the bottom of the load-lock chamber 3. A timing belt 49 spans between the driving pulley 46 and the driven pulley 47.

A cavity 50 is firmed in the linearly moving arm member 42, and a plurality of guide pulleys 51 are provided in the cavity 50. The timing bale 49 extends toward the distal end portion of the linearly moving arm member 42 via the plurality of guide pulleys 51 to be wound onto a driven pulley 52 is mounted on the pivotal shaft 43. The rotation of the driving pulley 46 causes the driven pulley 52 to rotate via the plurality of guide pulleys 51, and the rotation of the driven pulley 52 cause the swivel arm member 44 to swivel via the pivotal shaft 43.

Figure 10:
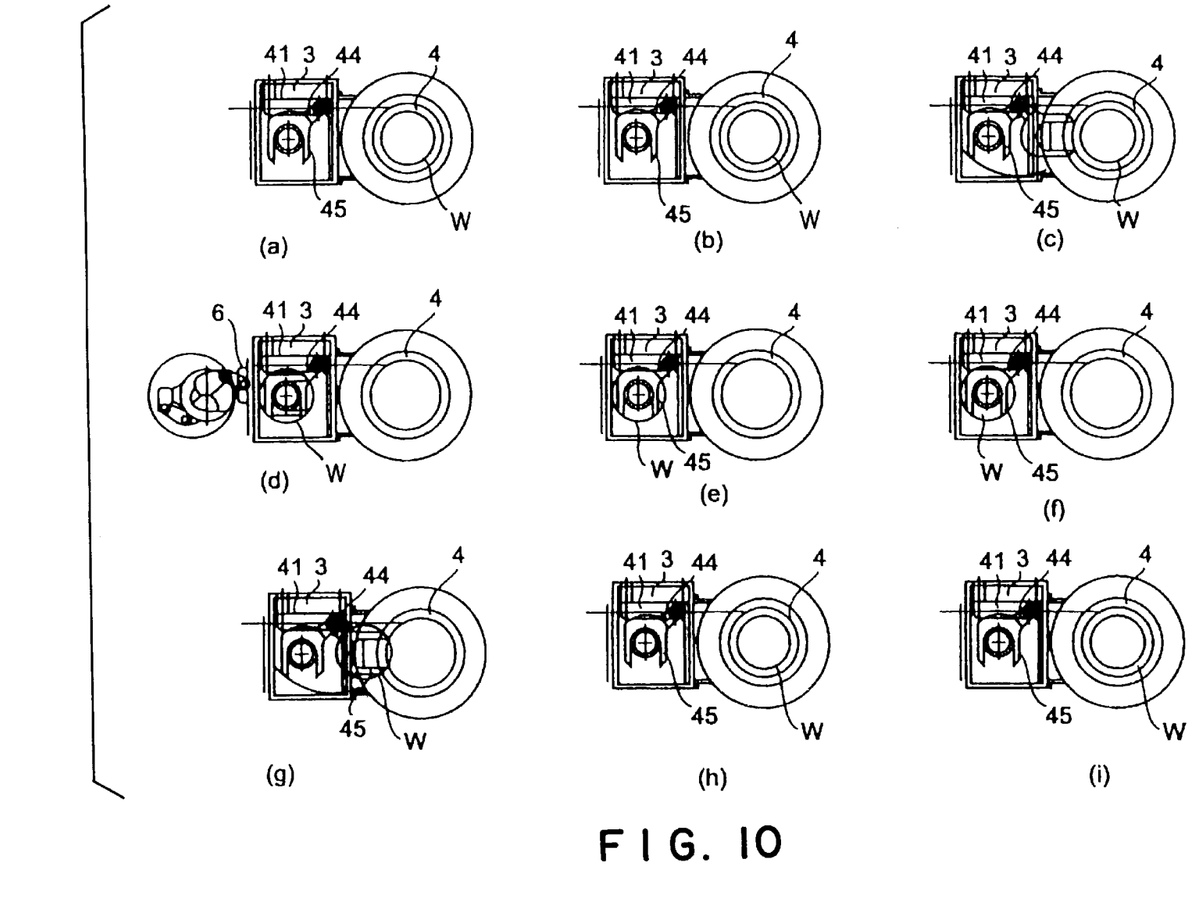
FIG. 10 is a schematic diagram showing the operation of the transfer system in the sixth preferred embodiment in each of stages.

Referring to FIG. 10, the operation of the sixth preferred embodiment of the present invention in each of stages (a) through (i) will be described below.

FIG. 10(a) shows a stage in which the wafer W is being etched in the process chamber 4. In this case, the process-chamber-side gate valve 26 is closed, and the transfer arm 41 is located in the load-lock chamber 3.

In the stage of FIG. 10(b), the etching process of the wafer W is completed, and the wafer W is moved upwards by the lifter pin 27. Simultaneously, the process-chamber-side gate valve 26 is open.

FIG. 10(c) shows a stage in which the processed wafer W is carried out of the process chamber 4. In this case, in FIG. 9a, when the driving pulley 46 is first rotated by the belt driving motor 48, the timing belt 49 travels to rotate the driven pulley 52, so that the swivel arm member 44 swivels about the pivotal shaft 43.

Then, in FIG. 9a, the motor 18 positively rotates, so that the ball screw 15 rotates. By the rotation of the ball screw 15, the nut 16 moves forward toward the process chamber 4 while being guided by the linear guide 17, and the transfer arm 41 moves forward. Then, when the supporting portion 45 including the pivotal shaft 43 of the linearly moving arm member 42 of the transfer arm 41 projects into the process chamber 4 to be positioned below the wafer W in the process chamber 4, the lifter pin 27 moves downwards, and the wafer W is mounted on the supporting portion 45.

FIG. 10(d) shows a stage in which the processed wafer W is carried out of the process chamber 4 to the load-lock chamber 3. In this case, in FIG. 9a, the motor 18 reversely moves, so that the ball screw 15 rotates. By the rotation of the ball screw 15, the nut 16 moves rearward while being guided by the linear guide 17, and the transfer arm 41 is retracted. Moreover, when the driving pulley 46 is reversely rotated by the belt driving motor 48, the timing belt 49 travels in a reverse direction to rotate the driven pulley 52, so that the swivel arm member 44 swivels about the pivotal shaft 43 in a reverse direction.

Then, when the wafer W supported on the supporting portion 45 of the swivel arm member 44 is transferred into the load-lock chamber 3, the process-chamber-side gate valve 26 is closed. Then, after $N_2$ gas is supplied into the load-lock chamber 3 so that the pressure in the load-lock chamber 3 is atmospheric pressure, the atmosphere-side gate valve 25 is open.

Then, the arm of the transfer arm mechanism 6 provided in the transfer chamber 2 (FIG. 1) extends to project into the load-lock chamber 3, and holds the processed wafer W supported on the raised lifter pin 35, to discharge the processed wafer W into a predetermined one of the cassettes 5 to house the processed wafer W therein. Moreover, the transfer arm mechanism 6 takes an unprocessed wafer W out of a predetermined one of the cassettes 5 to mount the unprocessed wafer W on the supporting portion 45 of the standby transfer arm 41. At this time, since the lifter pin 35 is raised by the air cylinder 36, the wafer W is supported on the lifter pin 35, and when the lifter pin 35 moves downwards, the wafer W is mounted on the supporting portion 45.

FIG. 10(e) shows a stage in which the process-chamber-side gate valve 26 remains being closed, and the atmosphere-side gate valve 25 is open so that the load-lock chamber 3 is open to atmosphere.

FIG. 10(f) shows a stage in which the atmosphere-side gate valve 25 is closed to evacuate the load-lock chamber 3, and the process-chamber-side gate valve 26 is open.

FIG. 10(g) shows a stage in which the unprocessed wafer W is carried into the process chamber 4. In this case, in FIG. 9a, when the driving pulley 46 is first rotated by the belt driving motor 48, the timing belt 49 travels to rotate the driven pulley 52, so that the swivel arm member 44 swivels about the pivotal shaft 43. Then, the motor 18 positively moves, so that the ball screw 15 rotates. By the rotation of the ball screw 15, the nut 16 moves forward toward the process chamber 4 while being guided by the linear guide 17, and the transfer arm 41 moves forward.

Then, the swivel arm member 44 including the supporting portion 45 of the transfer arm 41, on which the wafer W is supported, projects into the process chamber 4 to be positioned above the bottom electrode of the etching process mechanism 8 shown in FIG. 2a. Then, the wafer W on the supporting portion 45 is supported on the raised lifter pin 27 in the process chamber 4. After the transfer arm 41 is retracted, the lifter pin 27 moves downwards, and the wafer W is mounted on the bottom electrode.

FIG. 10(h) shows a stage in which the transfer arm 41 is retracted, the swivel arm member 44 swivels in a reverse direction, and the supporting portion 45 is located in the load-lock chamber 3. In this case, the process-chamber-side gate valve 26 is closed.

FIG. 10(i) shows a stage in which the etching process of the wafer W is started in the process chamber 4. In this case, the transfer arm 41 is waiting in the load-lock chamber 3 until the etching process is completed.

By repeating the above described operation in the stages of FIGS. 10(a) through 10(i), the wafer W can be carried into or carried out of the process chamber 4 by the transfer arm 41. According to the sixth preferred embodiment, by providing the transfer arm 41 having the swivel arm member 44 in the load-lock chamber 3, it is possible to miniaturize the load-lock chamber 3.

Furthermore, while rotation of the motor has been transmitted to the ball screw by means of the reduction gear in the linearly moving system serving as the driving part in the above described preferred embodiment, rotation of the motor may be transmitted to the ball screw by means of a timing belt.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A transfer system, for use in a vacuum process equipment comprising a process chamber and a load-lock chamber, for carrying an object to be processed into/out of said process chamber, said transfer system comprising:
   a first chamber formed in said load-lock chamber;
   a second chamber formed in said load-lock chamber, said second chamber having an internal pressure which is set to be lower than an internal pressure of said first chamber;
   linearly moving transfer arm means, provided in said first chamber, for carrying said object to be processed; and
   a driving part, provided in said second chamber, for linearly moving said transfer arm means with respect to said process chamber.

2. A transfer system as set forth in claim 1, wherein said transfer arm means has a pair of arm members, each of which has a proximal end portion connected to said driving part, and a distal end portion having a supporting portion for supporting thereon said object to be processed.

3. A transfer system as set forth in claim 1, wherein said transfer arm means has a single arm member which has a proximal end portion connected to said driving part, and a distal end portion having a supporting portion for supporting thereon said object to be processed.

4. A transfer system as set forth in claim 1, wherein said transfer arm means has a linearly moving arm member connected to said driving part, and a swivel arm member which is pivotably connected to said linearly moving arm member and which has a supporting portion for supporting said object to be processed.

5. A transfer system as set forth in claim 1, wherein said transfer arm means comprises upper-stage and lower-stage transfer arms,
   each of said transfer arms having a pair of arm members,
   each of said arm members having a proximal end portion connected to said driving part, and a distal end portion having a supporting portion for supporting thereon said object to be processed, and
   said driving part independently driving each of said transfer arms.

6. A transfer system as set forth in claim 1, wherein said transfer arm means comprises upper-stage and lower-stage transfer arms,
   each of said transfer arms having a single arm member,
   said arm member having a proximal end portion connected to said driving part, and a distal end portion having a supporting portion for supporting thereon said object to be processed, and
   said driving part independently driving each of said M transfer arms.

7. A transfer system as set forth in any one of claims 1 through 6, wherein said driving part comprises a motor, a ball screw rotated by said motor, and a nut which is engaged with said ball screw and which linearly moves.

8. A transfer system as set forth in any one of claims 1 through 6, which further comprises a buffer mechanism, provided in said load-lock chamber, for receiving said object supported on said transfer arm means.

9. A transfer system as set forth in any one of claims 1 thorough 6, which further comprises a pre-alignment mechanism, provided in said load-lock chamber, for pre-aligning said object supported on said transfer arm means.

* * * * *